United States Patent
Pelt et al.

(10) Patent No.: US 10,436,656 B2
(45) Date of Patent: Oct. 8, 2019

(54) IMPACT SENSOR

(71) Applicant: IEE International Electronics & Engineering S.A., Echternach (LU)

(72) Inventors: Thomas Pelt, Saarwellingen (DE); Christian Bour, Domprix (FR)

(73) Assignee: IEE INTERNATIONAL ELECTRONICS & ENGINEERING S.A., Echternach (LU)

( * ) Notice: Subject to any disclaimer, the term of this patent is extended or adjusted under 35 U.S.C. 154(b) by 5 days.

(21) Appl. No.: 15/525,019

(22) PCT Filed: Nov. 4, 2015

(86) PCT No.: PCT/EP2015/075732
§ 371 (c)(1),
(2) Date: May 5, 2017

(87) PCT Pub. No.: WO2016/071408
PCT Pub. Date: May 12, 2016

(65) Prior Publication Data
US 2017/0322096 A1      Nov. 9, 2017

(30) Foreign Application Priority Data

Nov. 6, 2014   (LU) .......................................... 92593

(51) Int. Cl.
| | | |
|---|---|---|
| *G01L 5/00* | (2006.01) | |
| *G01P 15/12* | (2006.01) | |
| *B81B 7/02* | (2006.01) | |
| *G01L 1/16* | (2006.01) | |
| *G01L 1/18* | (2006.01) | |
| *G01L 1/20* | (2006.01) | |

(Continued)

(52) U.S. Cl.
CPC .............. *G01L 5/0052* (2013.01); *B81B 7/02* (2013.01); *G01L 1/16* (2013.01); *G01L 1/18* (2013.01); *G01L 1/20* (2013.01); *G01P 15/08* (2013.01); *G01P 15/122* (2013.01); *G01P 15/123* (2013.01); *H01L 41/183* (2013.01); *H01L 41/37* (2013.01)

(58) Field of Classification Search
CPC ............ G01P 15/123; B60R 21/01013; B60R 21/0134; B60R 21/0136; B60R 2021/346
See application file for complete search history.

(56) References Cited

U.S. PATENT DOCUMENTS

| | | | | |
|---|---|---|---|---|
| 4,830,461 A | * | 5/1989 | Ishiharada | ............. B29C 35/06 385/13 |
| 5,079,535 A | * | 1/1992 | Neuman | ............. A61B 5/1135 73/775 |

(Continued)

OTHER PUBLICATIONS

International Search Report for International application No. PCT/EP2015/075732, dated Jan. 13, 2016, 3 pages.

(Continued)

*Primary Examiner* — Harshad R Patel
*Assistant Examiner* — Tran M. Tran
(74) *Attorney, Agent, or Firm* — Reising Ethington P.C.

(57) ABSTRACT

An impact sensor for a vehicle. The impact sensor includes at least one strain-sensitive sensor element which comprises a sensor material, and at least two terminals, between which the sensor material is electrically connected. The sensor material is a metal-containing carbon material.

17 Claims, 3 Drawing Sheets

(51) Int. Cl.
*G01P 15/08* (2006.01)
*H01L 41/18* (2006.01)
*H01L 41/37* (2013.01)

(56) References Cited

U.S. PATENT DOCUMENTS

| | | | | |
|---|---|---|---|---|
| 5,157,372 A * | 10/1992 | Langford | ............... | G01B 7/18 338/211 |
| 5,583,476 A * | 12/1996 | Langford | ............... | G01B 7/18 338/211 |
| 5,797,623 A * | 8/1998 | Hubbard | ............ | G01P 15/0907 280/735 |
| 6,169,479 B1 * | 1/2001 | Boran | ............... | B60R 21/0136 180/169 |
| 6,515,586 B1 * | 2/2003 | Wymore | ............... | G08B 13/10 307/116 |
| 6,840,538 B2 * | 1/2005 | Shields | ............... | B60R 21/0136 180/274 |
| 6,929,282 B1 * | 8/2005 | Zoratti | ............... | B60R 21/0132 180/274 |
| 7,150,199 B2 * | 12/2006 | Kieffer | ............... | G01L 1/2287 73/777 |
| 7,248,142 B2 * | 7/2007 | Beck | ............... | H01C 3/06 338/114 |
| 7,277,004 B2 * | 10/2007 | Beck | ............... | H01C 10/16 324/660 |
| 7,303,041 B2 * | 12/2007 | Stuve | ............... | B60R 21/0136 180/274 |
| 7,360,437 B2 * | 4/2008 | Hardwicke | ............ | G01L 1/2287 73/763 |
| 7,364,222 B2 * | 4/2008 | Tanabe | ............... | B60R 21/0136 293/4 |
| 7,397,340 B2 * | 7/2008 | Nakao | ............... | G01L 1/2287 338/2 |
| 7,443,082 B2 * | 10/2008 | Grumm | ............... | A61B 5/4818 310/339 |
| 7,523,670 B2 * | 4/2009 | Meyer | ............... | G01L 5/0014 73/774 |
| 7,543,474 B2 * | 6/2009 | Bieck | ............... | B60R 21/0136 73/11.01 |
| 7,733,219 B2 * | 6/2010 | Kamei | ............... | B60R 19/483 180/274 |
| 7,836,998 B2 * | 11/2010 | Bergvall | ............ | B60R 21/0136 180/274 |
| 8,112,930 B2 * | 2/2012 | Sietsema | ............... | F41A 21/04 42/76.02 |
| 8,931,351 B2 * | 1/2015 | Muramatsu | ............ | G01B 1/00 73/849 |
| 8,941,392 B1 * | 1/2015 | Reese | ............... | A61B 5/1071 324/671 |
| 8,984,954 B2 * | 3/2015 | Merrell | ............... | G01L 1/16 73/777 |
| 9,539,970 B2 * | 1/2017 | Kim | ............... | B62D 25/04 |
| 9,638,589 B2 * | 5/2017 | Fiori | ............... | G01L 25/00 |
| 9,682,856 B2 * | 6/2017 | Whitesides | ............ | B81B 7/02 |
| 2002/0097039 A1 * | 7/2002 | Khuri-Yakub | ............ | G01L 1/005 324/95 |
| 2005/0279177 A1 * | 12/2005 | Hsu | ............... | G01L 1/2287 73/775 |
| 2006/0131898 A1 * | 6/2006 | Shoji | ............... | B60R 19/483 293/4 |
| 2008/0193649 A1 * | 8/2008 | Jacquet | ............... | C23C 28/044 427/294 |
| 2010/0171583 A1 * | 7/2010 | Iovine | ............... | H01C 10/106 338/211 |
| 2014/0224018 A1 | 8/2014 | Whitesides et al. | | |
| 2014/0260653 A1 | 9/2014 | Merrell et al. | | |

OTHER PUBLICATIONS

Written Opinion for International application No. PCT/EP2015/075732, dated Jan. 13, 2016, 5 pages.

* cited by examiner

IMPACT SENSOR

TECHNICAL FIELD

The invention relates to an impact sensor, to an impact detection system and to a method for impact detection.

BACKGROUND ART

Due to more restrictive safety regulation requirements and general market development trends, automotive industry have to establish more efficient passenger and pedestrian protection systems by means of improved active safety devices (e.g. multiple airbag solutions, more sophisticated restraint systems, adapted system deployment strategies, etc.). In general, such techniques needs to more lead time to be activated in order to provide the full protection capability and/or additional data to be deployed in a more dedicated way according to the crash situation. In case of a collision event it is therefore essential to identify strong impacts as early as possible, i.e. in best case at the time of first contact with the car bumper.

Up to now, impact characterization is accomplished by so-called up-front sensors (also known as "g-sensors") located in the bumper area of the car, which detect crash-related acceleration effects caused by deformation and vibration. Although such sensor elements are well proven in various automotive applications, their detection efficiency is meanwhile hampered due to mechanically softer materials and design constraints of modern car front-ends in order to fulfil requirements related to pedestrian protection or energy savings.

Further, it is known to employ membrane switch sensors, which are usually integrated into the front or rear bumper of the car. These sensors are effective in fast detection of an impact and have a high sensitivity, but are characterized by an activation threshold. If a force or pressure acting on the sensor exceeds the threshold, the sensor is activated. I.e. although the first impact may be reliably detected, no information on the time evolution of the impact force can be gained from these sensors. Also, these sensors can be influenced by humidity and temperature. Finally, these sensors are usually large (e.g. 1500×20 mm) and when installed into a bumper, they require a straight integration with respect to the z (i.e. vertical) direction. However, a large sensor that may not be curved gives rise to integration problems.

SUMMARY

It is thus an object of the present invention to provide means for detecting an impact fast and reliably which allow for an easy integration into various vehicles. This object may be solved by the disclosed impact sensor, impact detection system and method for impact detection.

According to an aspect of the invention, there is provided an impact sensor for a vehicle. The vehicle may in particular be a motor vehicle like a car, e.g. a passenger car or a truck. Other types of vehicles are also within the scope of the invention, though, if impact detection is relevant for them. The term "impact sensor" refers to a sensor which may be used to at least detect whether an impact, i.e. a collision with another object like a pedestrian, another vehicle, a pole etc., has occurred. The sensor may also give additional information on the intensity of the impact or the like.

The impact sensor comprises at least one strain-sensitive sensor element, which comprises a sensor material, and at least two terminals, between which the sensor material is electrically connected. The terminals are used for electrical connection of the sensor material and are usually made of a well-conducting material. Optionally, they may be formed to facilitate a mechanical connection to external wires or the like. Otherwise, such a connection may be achieved by soldering, ultrasonic welding or other techniques known in the art.

When a voltage is applied between the terminals, a current flows through the sensor material which depends on its resistance. According to an embodiment of the invention, the sensor material is a metal-containing carbon material. These materials are known to have a resistance that changes when they are subjected to strain, i.e. they are piezoresistive. In particular, when the impact sensor is bent, this results in a variation of the resistance of the sensor material. Since the variation can easily be as much as several hundreds of ohms under normal impact conditions, an impact can safely be detected. The reaction of such a sensor is fast and the resistance is easy to measure. Also, sensors of this type can have virtually any shape, i.e. there are hardly any integration problems.

An important advantage of metal containing carbon materials is that they are practically not affected by temperature changes. The resistance depends only negligibly on the temperature, at least under the expected working conditions of a vehicle like a car. Also, these sensors do not require ventilation channels like membrane switch sensors, therefore they are not significantly affected by humidity.

The size and shape of the impact sensor can vary widely. Preferably, the sensor is flat and/or elongate. When installed in a vehicle component like a bumper, the sensor may be aligned more or less along the surface of the component, where an elongate shape allows to cover a significant distance along the surface. The shape of the sensor may be straight, angled and/or curved.

The sensor material may be disposed as an elongate or line-shaped structure. Optionally, the structure may be meandering in order to increase the effective length subjected to a bending effect, which also increases the change in resistance.

Preferably, the sensor material is nickel-containing hydrogenated amorphous carbon. Nickel containing carbon films (often termed as Ni containing hydrogenated amorphous carbon, shortly Ni:a-C:H) yield a strain sensitivity (gauge factor) of approx. 20 together with a temperature coefficient of resistance (TCR) below ±50 ppm/K in the wide temperature range of 100 K to 400 K.

In a preferred embodiment, the impact sensor comprises a carrier element. Preferably, the sensor material is disposed on this carrier element as a layer having a thickness of 10-100 nm. A layer of this thickness is sufficient for providing reliable sensor characteristics. In particular, the layer may be a sputtered layer, i.e. the sensor material has been deposited on the carrier element by sputtering.

It is preferred that the carrier element is a polymer sheet, in particular a polyimide sheet. Such a polymer sheet may be highly flexible and can be adapted to different structures. E.g. if the sensor is to be placed adjacent a slightly curved surface of the vehicle, the sheet can be easily bent to follow the curvature of the surface. The thickness of the sheet can be varied within a relatively wide range, for example from 50 μm up to less than 200 μm for flexibility reasons. Needless to say, a polymer sheet of this thickness has a negligible weight compared to the vehicle. It is also conceivable that other materials than polymers are used for a sheet which forms the carrier element.

It is preferred that the terminals are screen printed. In the screen printing process, a conductive ink, usually a metal-containing ink, is applied to the substrate. This application process is especially suitable for a polymer sheet as a carrier element, but may also be utilized in connection with other carrier elements. Terminals of this type also may be provided as very thin layers, e.g. 1-50 µm in thickness. It is preferred that the ink is a silver-containing ink.

The inventive impact sensor can be designed relatively small. In particular, a maximum dimension of the impact sensor may be less than 200 mm. E.g., the sensor may be elongate having a width greater than a height. Herein, the width can be less than 200 mm, preferably 100 mm or less. The small design allows to integrate a single sensor in relatively small areas of the vehicle, thus avoiding integration problems arising from obstructing objects. Nevertheless, a large area of a vehicle surface may be monitored by providing a plurality of sensors, each of which is smaller than sensors common in the art. Prior art sensors are for instance typically wider than 1000 mm, because they are manufactured in a single piece for cost saving reasons (crimps, cables, electronics are less for a single sensor) and have to cover the whole car bumper width.

It should be noted that if desired a single sensor can be configured to cover the full width of the vehicle bumper. In that case a single sensor may be designed to have length of up to 1800 mm or more.

In accordance with another aspect of the invention there is provided an impact detection system for a vehicle. Such an impact detection system comprises at least one inventive impact sensor. Of course, it may comprise additional sensors, support elements, wiring and other components, some of which are discussed below.

It is preferred that the at least one sensor is positioned relatively close to the surface where an impact occurs first. This makes it easier to allow for an early crash detection. Therefore it is preferred that the crash detection system also comprises an exterior component for the vehicle, in which the at least one impact sensor is disposed. The term "exterior component" primarily refers to the front and rear bumper of a car or the like. However, this also refers to other parts which may be directly hit in the event of an impact. For instance, if a side impact is considered, the door or wing of a car is considered as the respective exterior component.

It is particularly preferred that at least one sensor, preferably all sensors, are disposed adjacent to an outer surface of the exterior component. Usually, a component like a bumper comprises an solid outer plastic skin, under which a foam layer or a plastic absorber is disposed. While many impact sensors known in the art are disposed in the foam layer, the inventive sensors may be disposed adjacent to—or even within—the plastic skin.

Usually, the impact detection system comprises a plurality of impact sensors, which are staggered along the exterior component. "Staggered" means that the sensors are positioned differently along a possible impact surface; normally, they are positioned adjacent to each other or spaced apart. It is, however, also conceivable that two neighboring sensors overlap. In such a staggered configuration, several sensors (e.g. 3 to 5) may be connected to a component like a vehicle bumper. Instead of using one large sensor, several sensors can be disposed along the width of the bumper (or other component). Here, the sensors may not only have different lateral positions, but also different vertical positions, for instance to avoid an obstructing component like a light, a number plate holder etc. Furthermore, differently shaped sensors can be combined. As mentioned before, the inventive sensor can have practically any shape. Therefore, it is conceivable to combine a curved sensor with a straight sensor or the like. Thus, a modular system could be used to create almost any shape.

In a preferred embodiment, the crash detection system comprises a processing unit, which is connected to the at least one impact sensor and is configured to identify an impact situation based on a variation of the electrical resistance of the at least one impact sensor. Of course, this refers to the electrical resistance of the sensor element, or rather the sensor material, which is connected between the terminals. The processing unit can be a dedicated device or it may be an on-board computer of the vehicle, which also handles other, e.g. non-safety operations. Such processing units are known in the art and will not be described in detail here. It is understood that the processing unit may further be connected to at least one safety device and to be configured to deploy this safety device upon detection and identification of a crash situation. This may refer to activating belt tensioner, deploying an airbag (inside or outside airbag), adjusting a seat position, deploying actuators of an active hood (to be lifted for pedestrian protection)_or the like.

Apart from detecting that an impact has occurred, the processing unit may also evaluate the time evolution of the electrical resistance and/or its variation. If the variation stays small, the impacting object may be of minor importance, e.g. like a ball hitting the vehicle. In such a case, no safety device may be deployed at all. If the variation, however, increases over a certain time period, this indicates a massive object, which necessitates appropriate security measures. The ramp of the increase and/or the total amount of increase can also give information on the severity of the impact. In particular, certain thresholds may be defined in the processing unit which indicate that the impact is more or less severe. Appropriate security systems for each degree of severity may be deployed.

To allow for a more accurate determination of the severity of the impact, the sensors in a particular exterior component may be calibrated. For a given component, like a vehicle bumper, the sensors are calibrated so that, for each of them, their electrical resistance variation vs. impact energy at their specific location is known. In other words, an impact with known impact energy is created and the resistance variation of the specific sensor is measured. This also enables to take into account local bumper geometry or thickness variations.

Preferably, the processing unit is connected to individually measure the resistance of each of a plurality of subsets of a plurality of impact sensors. Here, the detection system comprises a plurality of impact sensors and "subset" refers to a part of this plurality. Each subset comprises at least one sensor. In particular, each subset may comprise exactly one sensor, so that the processing unit is connected to individually measure the resistance of each sensor. As the processing unit can measure the resistance of the subgroups/sensors individually, it can be distinguished by the location of the respective sensor(s) where an impact has occurred. It should be noted that a subset may comprise several sensors which are connected in series via their terminals, so that the processing unit measures the collective resistance—and the collective resistance variation—of these sensors.

In particular, but not exclusively, in the abovementioned embodiment, the processing unit may be configured to identify an impact location based on the location of at least one impact sensor which shows a variation of its electrical resistance. Of course, several sensors may respond, which may indicate either multiple impacts or a wide impacting object. The processing unit may be configured to detect an (approximate) impact width based on the number of (neighboring) impact sensors which are responding.

Alternatively or additionally, the processing unit can be configured to determine an impact energy based on a combination of the variations of the electrical resistances of several impact sensors, in particular of all impact sensors. Of course, the impact energy can only be approximately determined or estimated by this measure. However, it has been shown that there is a good correlation between the cumulated (or total) resistance variation and the impact energy. Therefore, the severity of the impact can be determined and appropriate security measures can be triggered. It should be noted that, as mentioned above, some sensors may be deformed less due to a different stiffness of the component they are integrated in. In such a case, the variation of the electrical resistance may be weighted with a factor to compensate for such effects.

According to yet another aspect of the invention, there is provided a method for impact detection for a vehicle, with at least one inventive impact sensor. The method comprises measuring the electrical resistance of the at least one impact sensor and identifying an impact situation based on a variation of said electrical resistance. The method may be performed by a processing unit as described above. Preferred embodiments of the method correspond to those of the impact detection system and will not be described again in detail.

In preferred embodiments, the at least one impact sensor may be disposed in an exterior component for the vehicle. A plurality of impact sensors may be disposed staggered along the exterior component. The processing unit may individually measure the resistance of each of a plurality of subsets of a plurality of impact sensors. The processing unit may identify an impact location based on the location of at least one impact sensor which shows a variation of its electrical resistance. Also, the processing unit may determine an impact energy based on a combination of the variations of the electrical resistances of several impact sensors.

BRIEF DESCRIPTION OF THE DRAWINGS

Preferred embodiments of the invention will now be described, by way of example, with reference to the accompanying drawings, in which.

DETAILED DESCRIPTION

Figure 1:
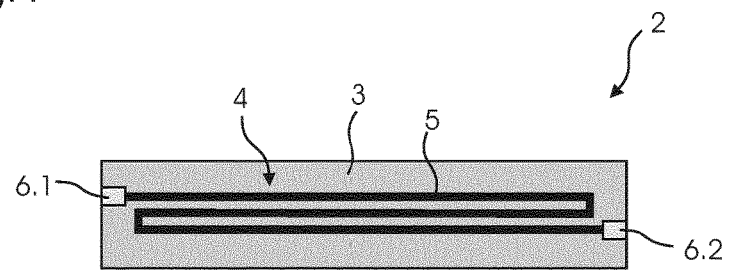
FIG. 1 is a schematic representation of an embodiment of an inventive impact sensor.

FIG. 1 shows a schematic view of an impact sensor 2 according to an embodiment of the present invention. The impact sensor 2 is generally rectangular in shape having a length of approximately 100 mm and a width of 15 mm. It is understood, though, that the size and the shape of the impact sensor 2 could be varied. The shape is generally given by a rectangular polymer sheet 3, which has a thickness of 100 µm. In the embodiment shown, the polymer sheet 3 is made of polyimide. On this polymer sheet 3, a layer of sensor material 5 is disposed. The sensor material 5 is Nickel-containing hydrogenated amorphous carbon (Ni: a-C:H), which has been disposed on the polymer sheet 3 by sputtering. The thickness of the layer of sensor material 5 is about 60 nm. The sensor material 5, which is part of a strain-sensitive sensor element 4, is electrically connected between two terminals 6.1, 6.2. These terminals 6.1, 6.2 are made of silver ink and have been disposed on the polymer sheet 3 by screen printing. The thickness of the terminals 6.1, 6.2 is about 20 µm.

As can be seen from the dimensions described above, the impact sensor 2 is highly flexible and may be bent easily. When such bending occurs, the electrical resistance of the sensor material 5 undergoes a variation. In the present embodiment, this variation is increased by a meandering structure of the sensor element 4. The variation is easily detectable when a voltage is applied to the terminals 6.1, 6.2 and the current is measured.

In order to protect the thin layers of the sensor element 4 and the terminals 6.1, 6.2, a protective cover layer will generally be added. For sake of simplicity, such a cover layer is not shown in FIG. 1.

Figure 2:
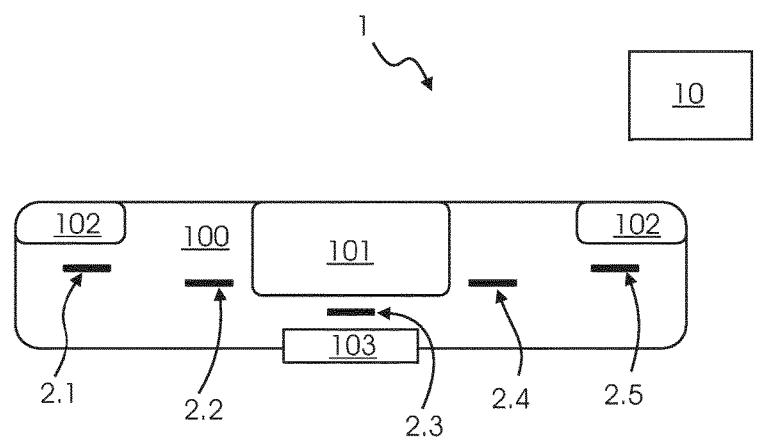
FIG. 2 is a schematic view of a vehicle front with an embodiment of an inventive impact detection system.

FIG. 2 schematically illustrates a vehicle front with a bumper 100, a radiator 101, headlights 102 and number plate holder 103. Five impact sensors 2.1-2.5 are integrated into the bumper 100. The bumper may have a common structure with a hard outer plastic skin and a foam or a plastic absorber filling. In this case, the impact sensors 2.1-2.5 may be integrated immediately underneath the plastic skin, so that they can detect any impact immediately.

The impact sensors 2.1-2.5 are part of an impact detection system 1. They are identical to the impact sensor 2 shown in FIG. 1. Each of them is connected via terminals 6.1, 6.2 to a processing unit 10. For sake of simplicity, the connections are not shown in FIG. 2. The processing unit 10 is configured to apply a voltage to each of the impact sensors 2.1-2.5 and to measure the electrical resistance. During normal operation of the vehicle, the resistance is nearly constant, because the sensor material 5 is practically not influenced by temperature changes or humidity.

As can be seen from FIG. 2, the sensors 2.1-2.5 are disposed in a staggered manner along the bumper 100. In the embodiment shown, the sensors 2.1-2.5 laterally spaced apart, but they might also be disposed next to each other. The third sensor 2.3 is disposed considerably lower than the other sensors 2.1, 2.2, 2.4, 2.5 in order to avoid the radiator 101.

Figure 3:
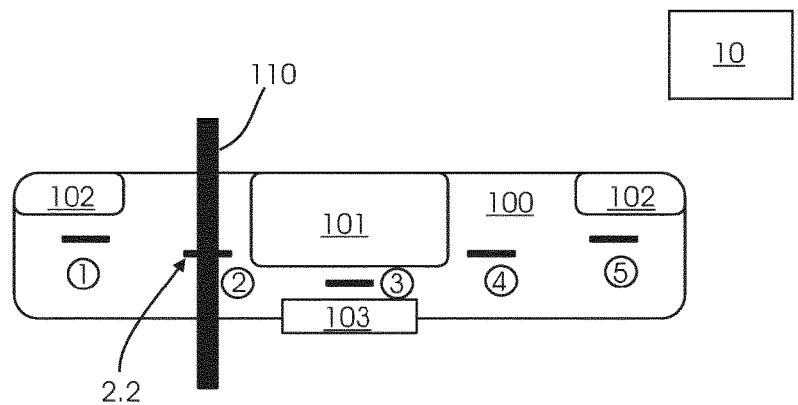
FIG. 3 is a schematic view of the vehicle front of FIG. 2 with an impacting object in a first position.

FIG. 3 shows an impact situation, wherein the bumper 100 collides with a stationary pole 110 in the region of the second impact sensor 2.2. The impact leads to a deformation of the bumper 100, and thus to a deformation of the impact sensor 2.2, which in turn leads to a variation of the resistance of the impact sensor 2.2.

Figure 4:
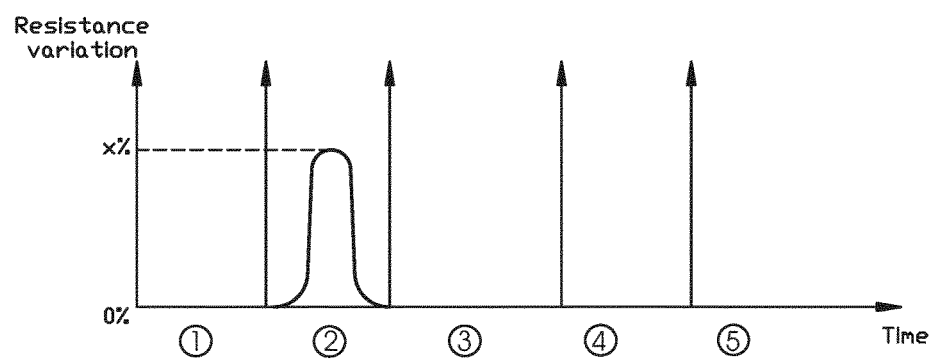
FIG. 4 is a diagram illustrating the time evolution of the resistance variation of the impact sensors corresponding to FIG. 3.

FIG. 4 illustrates the resistance variation of the sensors 2.1-2.5 over time. What is shown is actually the variation of electrical resistance of sensor 2.2 vs time. The partial diagrams are labelled with numbers in circles, which corresponds to the numbers shown in FIG. 3. Since the first sensor 2.1 and the third through fifth sensor 2.3-2.5 are unaffected by the impact, there resistance remains constant, wherefore their variation is zero.

The resistance of the second sensor 2.2, however, shows a considerable increase as the pole 110 is hit. The increase is shown by the curve in FIG. 4. Depending on the speed of the vehicle, usually within a few milliseconds, the curve reaches a peak value, marked by the dashed line in FIG. 4. After some time, the deformation of the sensor 2.2 has reached a maximum value, wherefore the resistance variation goes back to zero.

Figure 5:
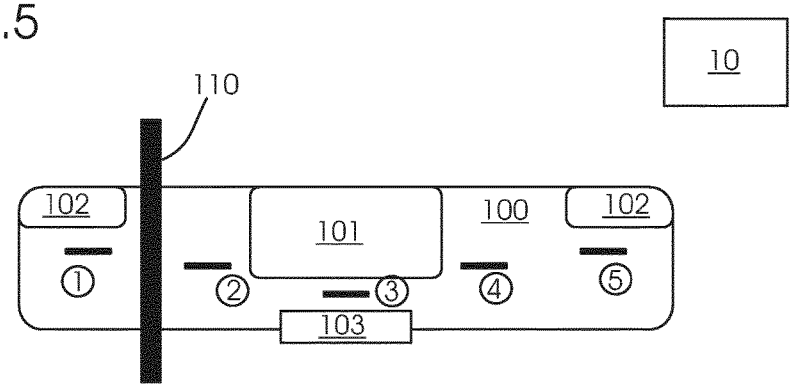
FIG. 5 is a schematic view of the vehicle front of FIG. 2 with an impacting object in a second position.

FIG. 5 shows a similar impact situation as FIG. 3. In this case, however, the bumper 100 collides with the stationary pole 110 in between the first impact sensor 2.1 and the second impact sensor 2.2. In this case, the deformation of the bumper 100 leads to a deformation of both impact sensors 2.1, 2.2, which, however, is not as severe as in the scenario shown in FIG. 3, because neither of the impact sensors is hit directly. Again, the deformation of the impact sensors 2.1, 2.2 leads to a variation of their resistance.

Figure 6:
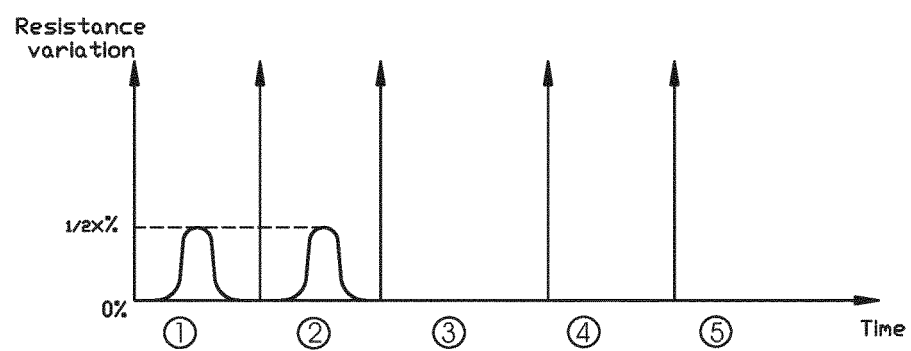
FIG. 6 is a diagram illustrating the time evolution of the resistance variation of the impact sensors corresponding to FIG. 5.

FIG. 6, similar to FIG. 4, illustrates the resistance variation of the sensors 2.1-2.5 over time. Again, the third through fifth sensor 2.3-2.5 are unaffected by the impact, wherefore their resistance remains constant and their variation is zero.

The resistance of the first and second sensor 2.2, however, each increase in the process of the impact, shown by the curves in FIG. 6. The overall shape of the curves is similar to the curve shown in FIG. 4. However, since neither of the first and second impact sensor 2.1, 2.2 is deformed as severely as in the previous scenario, each of the curves reaches a peak value that is approximately half as high as the peak value in FIG. 4.

In each of the scenarios shown in FIG. 3 and the FIG. 5, respectively, the processing unit 10 can detect the impact location based on the location of the impact sensors which are responding, i.e. which show a variation of their resistance. Furthermore, the cumulated resistance variation of all impact sensors 2.1-2.5 is calculated and used as a measure for the total energy of the impact. It should be noted that, although the peak value of the individual curves in FIG. 6 is less than in the FIG. 4, the integral of both curves, representing the cumulated resistance variation, is approximately the same as in FIG. 4. Therefore, a realistic estimate of the severity of the impact can be derived.

In order to derive the impact energy from the resistance variation, a calibration process may be performed with a bumper 100 having the same configuration of impact sensors 2.1-2.5. In such a calibration process, several impacts with known energy can be generated and the resistance variation of the impact sensors can be measured. The measured values can be used for database of the processing unit 10.

FIG. 6 represents a situation in which both sensors 2.1, 2.2 are equally affected if the impact location is in the middle between both sensors 2.1, 2.2. If, however, the bumper in the area of the first sensor 2.1 has a greater stiffness then in the area of the second sensor 2.2, this would lead to a minor deformation of the first sensor 2.1. Anyhow, such effects can be accounted for if a calibration process as described above is performed. In calculating the cumulated resistance variation, the processing unit may apply weighting factors to the individual variations instead of simply summing them up.

In any case, the impact detection system 1 can detect and evaluate an impact situation practically without any delay, because the impact sensors 2.1-2.5 are disposed immediately at the location of the impact. Also, since the resistance of the individual sensors 2.1-2.5 is easy to measure and does not depend on temperature or humidity, the system 1 is very reliable.

The invention claimed is:

1. An impact sensor for a vehicle, comprising:
   at least one strain-sensitive sensor element which comprises a sensor material disposed as a layer on a carrier element, said sensor material being a nickel-containing hydrogenated amorphous carbon material, and
   at least two terminals disposed at opposite ends of the carrier element, between which the sensor material is electrically connected.

2. The impact sensor according to claim 1, wherein the layer of sensor material has a thickness of 10-100 nm.

3. The impact sensor according to claim 2, wherein the layer is a sputtered layer.

4. The impact sensor according to claim 2, wherein the terminals are screen printed onto said carrier element.

5. The impact sensor according to claim 1, wherein the carrier element is a polymer sheet.

6. The impact sensor according to claim 1, wherein a maximum dimension of the impact sensor is less than 200 mm.

7. An impact detection system for a vehicle, comprising at least one impact sensor, said impact sensor comprising:
   at least one strain-sensitive sensor element which comprises a sensor material disposed as a layer on a carrier element, said sensor material being a nickel-containing hydrogenated amorphous carbon material, and
   at least two terminals disposed at opposite ends of the carrier element, between which the sensor material is electrically connected.

8. The impact detection system according to claim 7, further comprising an exterior component for the vehicle, in which the at least one impact sensor is disposed.

9. The impact detection system according to claim 8, a plurality of impact sensors which are staggered along the exterior component.

10. The impact detection system according to claim 7, further comprising a processing unit, which is connected to the at least one impact sensor, said processing unit being configured to identify an impact situation based on a variation of the electrical resistance of the at least one impact sensor.

11. The impact detection system according to claim 10, wherein the processing unit is connected and configured to individually measure the resistance of each of a plurality of subsets of a plurality of impact sensors.

12. The impact detection system according to claim 10, wherein the processing unit is configured to identify an impact location based on a location of at least one impact sensor which shows a variation of its electrical resistance.

13. The impact detection system according to claim 10, wherein the processing unit is configured to determine an impact energy based on a combination of the variations of the electrical resistances of several impact sensors.

14. The impact detection system according to claim 7, wherein the layer of sensor material has a thickness of 10-100 nm.

15. The impact detection system according to claim 14, wherein the layer is a sputtered layer.

16. The impact detection system according to claim 14, wherein the carrier element is a polymer sheet.

17. A method for impact detection for a vehicle, with at least one impact sensor, said impact sensor comprising:
   at least one strain-sensitive sensor element which comprises a sensor material disposed as a layer on a carrier element, said sensor material being a nickel-containing hydrogenated amorphous carbon material, and
   at least two terminals disposed at opposite ends of the carrier element, between which the sensor material is electrically connected;

the method comprising the steps of:

measuring the electrical resistance of the at least one impact sensor; and identifying an impact situation based on a variation said electrical resistance.

\* \* \* \* \*